(12) United States Patent
Tsunoda et al.

(10) Patent No.: US 8,278,908 B2
(45) Date of Patent: Oct. 2, 2012

(54) METHOD FOR MEASURING ELECTRIC POTENTIAL DISTRIBUTION ON A SURFACE OF A SAMPLE, AND CHARGED PARTICLE BEAM SYSTEM

(75) Inventors: Masahiro Tsunoda, Hitachinaka (JP); Kouki Miyahara, Hitachinaka (JP); Katsuya Kawakami, Mito (JP); Takashi Gunji, Mito (JP)

(73) Assignee: Hitachi High-Technologies Corporation, Tokyo (JP)

( * ) Notice: Subject to any disclaimer, the term of this patent is extended or adjusted under 35 U.S.C. 154(b) by 263 days.

(21) Appl. No.: 12/396,579

(22) Filed: Mar. 3, 2009

(65) Prior Publication Data

US 2009/0224749 A1   Sep. 10, 2009

(30) Foreign Application Priority Data

Mar. 5, 2008   (JP) ................. 2008-054222

(51) Int. Cl.
*G01R 19/00* (2006.01)
*G01R 31/305* (2006.01)

(52) U.S. Cl. ................. 324/76.11; 324/754.22

(58) Field of Classification Search .......... None
See application file for complete search history.

(56) References Cited

U.S. PATENT DOCUMENTS

| | | | |
|---|---|---|---|
| 5,493,236 A * | 2/1996 | Ishii et al. | 324/750.22 |
| 6,507,474 B1 | 1/2003 | Singh et al. | |
| 6,515,494 B1 * | 2/2003 | Low | 324/750.23 |
| 6,583,414 B2 * | 6/2003 | Nozoe et al. | 250/310 |
| 6,946,656 B2 | 9/2005 | Ezumi et al. | |
| 2007/0221845 A1 | 9/2007 | Komuro et al. | |

FOREIGN PATENT DOCUMENTS

| | | |
|---|---|---|
| JP | 05-067667 | 3/1993 |
| JP | 2001-052642 | 2/2001 |

OTHER PUBLICATIONS

Japanese Office Action issued in Japanese Patent Application No. 2008-054222, dated Jul. 8, 2010.

* cited by examiner

*Primary Examiner* — Vinh Nguyen
(74) *Attorney, Agent, or Firm* — McDermott Will & Emery LLP

(57) ABSTRACT

A charged particle beam system for measuring a sample such as a photomask is provided. The system is capable of adjusting its condition with high accuracy to measure the sample even when a back surface of the sample is charged. The charged particle beam system measures an electric potential distribution on the back surface of the sample during a process for transporting the sample. The system controls the degree of charge neutralization of the sample based on the result of the measurement, or estimates or calculates an electric potential distribution appearing on a front surface of the sample and obtained when the sample is placed on the sample holder or the like. The system is capable of measuring or inspecting the sample such as a photomask at high speed and with high accuracy even when the sample has a large amount of charges accumulated on its surface different from its pattern surface.

8 Claims, 3 Drawing Sheets

METHOD FOR MEASURING ELECTRIC POTENTIAL DISTRIBUTION ON A SURFACE OF A SAMPLE, AND CHARGED PARTICLE BEAM SYSTEM

BACKGROUND OF THE INVENTION

1. Field of the Invention

The present invention relates to a charged particle beam system for measuring and inspecting a sample, and more particularly to a system for measuring and inspecting a sample having an insulating film and a pattern fabricated on the insulating film, such as a photomask.

2. Description of the Related Art

The size of a photomask used to manufacture a semiconductor device has been reduced with high density packaging of a pattern. With this tendency, a system for inspecting and measuring a photomask needs to be more accurate. A charged particle beam system represented by a scanning electron microscope (SEM) is mainly used to inspect and measure a photomask.

The photomask is mainly made of quartz that is an insulator. The photomask typically has a front surface on which an integrated circuit pattern is fabricated. The integrated circuit pattern is made of chrome and drawn by an electron beam lithography system or the like. The chrome pattern is covered with a resist pattern (photosensitive agent) drawn by the electron beam lithography system or the like.

For example, when a critical dimension scanning electron microscope is used to measure a photomask, a back surface of the photomask may be charged depending on a pattern manufacturing process, handling of the photomask, or the condition of storage of the photomask due to exposure of quartz (that is an insulator) to the outside of the photomask from the back surface of the photomask.

A charge accumulated on a sample may cause a shift of the focal point of a scanning electron microscope used to measure the sample or cause a magnification fluctuation of the scanning electron microscope. This may cause a measurement error.

JP-A-2001-52642 discloses a scanning electron microscope including a plurality of electrometers and a sample chamber. The electrometers are provided in the sample chamber and measure an electric potential on a front surface of a sample. Based on the measured electric potential, the scanning electron microscope performs a feedback process on an acceleration voltage applied to emit an electron beam and on a retarding voltage.

In addition, WO03-007330 (corresponding to U.S. Pat. No. 6,946,656) discloses a scanning electron microscope that measures an electric potential distribution on the surface of a sample and performs a feedback process on a retarding voltage and the like during a process for transporting the sample.

In addition, U.S. Pat. No. 6,507,474 discloses that an electrometer is used to measure charges accumulated on a target sample such as a mask and an ionizer is used to neutralize the charges.

SUMMARY OF THE INVENTION

A sample such as a photomask has a front surface with a chrome pattern fabricated thereon, for example. The front surface is also called a pattern surface. A surface of the sample, which is located on the opposite side of the pattern surface, is called a back surface. The pattern surface is to be measured by a critical dimension scanning electron microscope. The back surface may have a large amount of charges accumulated thereon. When the sample is placed on a sample holder of the critical dimension scanning electron microscope in order to measure the pattern surface, a distribution of electric potentials of the charges accumulated on the back surface of the sample may be reflected to the pattern surface of the sample.

As described in JP-A-2001-52642, the plurality of electrometers is provided in the sample chamber. In order to measure an electric potential on the pattern surface (front surface) of the sample, a period of time for measuring the electric potential is required in addition to a period of time for measuring the amount of charges by means of the scanning electron microscope. This results in a large reduction in the throughput of the measurement performed by the scanning electron microscope. Especially, since a distribution of charges accumulated on a photomask is not uniform, a time for arranging an electrometer at a desired point (of the photomask) to be measured is required. It is considered that a large number of electrometers are arranged to measure the entire surface of the sample so as to almost solve the problem with the throughput. It is, however, difficult to arrange a large number of electrometers in a limited vacuum space due to technical and cost problems.

Each of WO03-007330 and U.S. Pat. No. 6,507,474 describes the amount of charges accumulated on the sample is measured in a process for transporting the sample to a sample chamber and is not measured in the sample chamber. This makes it possible to measure a distribution of the charges without a reduction in the throughput of the measurement. In these techniques, however, the following problems arise.

As described above, a large amount of charges may be accumulated on the back surface (located on the opposite side of the pattern surface to be measured by the scanning electron microscope) of the sample such as a photomask. The distribution of the charges appears on the side of the pattern surface when the sample is placed on the sample holder for the measurement by the scanning electron microscope. Each of WO03-007330 and U.S. Pat. No. 6,507,474 describes that the amount of charges accumulated on the sample on the side of the pattern surface is measured in the process for transporting the sample to the sample chamber. However, the charges appearing when the sample is placed on the sample holder or the like cannot be confirmed by the system described in each of WO03-007330 and U.S. Pat. No. 6,507,474. As a result, a condition (focal point of a charged particle beam, the magnification of the microscope, and the like) of a system described in each of WO03-007330 and U.S. Pat. No. 6,507,474 cannot be appropriately adjusted based on the measurement result.

An object of the present invention is to provide a charged particle beam system that is adapted to measure a sample such as a photomask and capable of adjusting a condition thereof with high accuracy even when a back surface of the sample is electrically charged.

In order to accomplish the object of the present invention, a charged particle beam system according to an aspect of the present invention measures an electric potential distribution on the back surface of the sample during a process for transporting the sample. In addition, the system controls the degree of neutralization of the sample based on the result of the measurement, or estimates or calculates an electric potential distribution on a front surface of the sample when the sample is placed on the sample holder or the like.

According to an aspect of the present invention, the charged particle beam system is capable of measuring or inspecting the sample (such as a photomask) at high speed and with high accuracy even when the sample has a large amount of charges accumulated on its back surface located on the opposite side of a pattern surface of the sample.

BRIEF DESCRIPTION OF THE DRAWINGS

Other objects and advantages of the invention will become apparent from the following description of embodiments with reference to the accompanying drawings in which.

DESCRIPTION OF THE PREFERRED EMBODIMENTS

Figure 1:
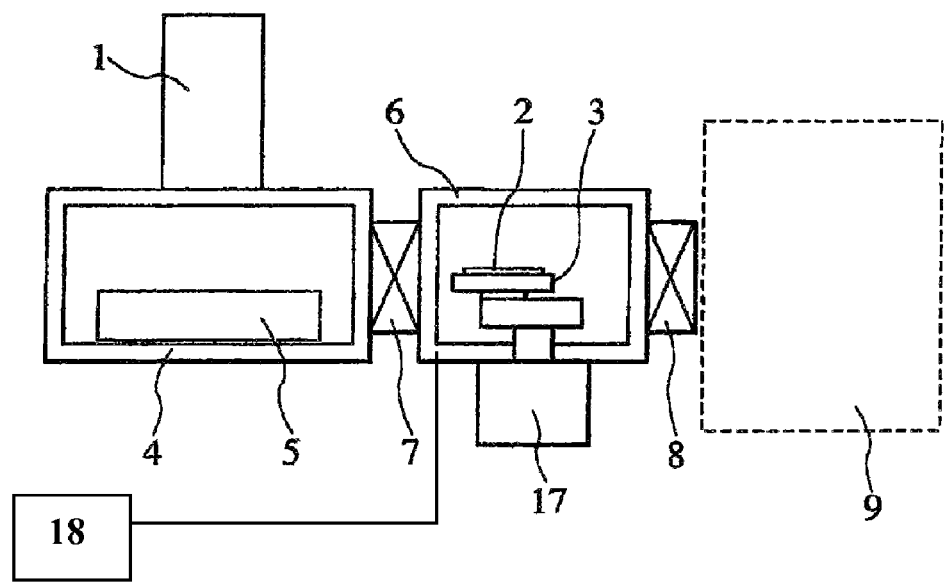
FIG. 1 is a system diagram showing a critical dimension scanning electron microscope designed to measure a photomask.

A description is made of a system for measuring and inspecting, at high speed and with high accuracy, a sample having a back surface on which a large amount of charges may be accumulated, with reference to the accompanying drawings. In the following example, a scanning electron microscope is used as a charged particle beam system. However, the charged particle beam system is not limited to the scanning electron microscope. For example, a focused ion beam system which emits ion beam to irradiate the sample may be used as the charged particle beam system. In addition, the charged particle beam system may be a system with a focus condition varying depending on the charged state of a sample.

It is apparent that the surface of a photomask is charged due to a friction during resist coating using a spin coater or is charged in a process for manufacturing a semiconductor, e.g., in an etching process using plasma. In order to prevent a pattern fabricated on the surface of the photomask from being broken, the charged state of the surface needs to be strictly managed by, for example, neutralizing charges after the process for fabricating the pattern.

However, a photomask, which is to be inspected by a critical dimension scanning electron microscope designed to measure a photomask, has a front surface with an integrated circuit pattern made of chrome and drawn by an electron beam lithography system or the like or has a front surface with a resist pattern (photosensitive agent) fabricated on the chrome and drawn by the electron beam lithography system or the like. In addition, the photomask, which is to be inspected by the critical dimension scanning electron microscope (designed to measure a photomask), has a back surface mainly made of quartz that is an insulator. The photomask may be charged depending on a process for manufacturing such a pattern, handling of the photomask, or the stored state of the photomask.

The amount of charges accumulated on the photomask varies depending on a method for contacting and holding the photomask, e.g., depending on a handled portion of the photomask and the stored state of the photomask. Since the quartz is exposed from the back surface of the photomask to the outside of the photomask, charges are distributed to an end portion of the back surface of the photomask.

When the photomask is transported to a sample holder of the critical dimension scanning electron microscope, an inversion electric charge appears on the front surface of the photomask due to polarization in the quartz. This effect may cause a shift of the focal point of a charged particle beam or cause a variation in the magnification of the microscope. Thus, a measurement error may occur. It is possible to neutralize the charges accumulated on the back surface of the photomask by means of an ionizer or the like before the photomask is transported to the sample holder of the critical dimension scanning electron microscope. However, the charges on the back surface of the photomask are distributed to the end portion of the back surface of the photomask and the amount of the charges is not constant. It is necessary that a period of time for neutralizing the charges be set based on the worst condition. This results in a reduction in the number of samples to be measured and inspected by the charged particle beam system.

Although the chrome that is a conductive material is present on the front surface of the photomask, the entire front surface of the photomask tends to be charged. The chrome extends to a small area of a side surface of the photomask due to the formation of the pattern made of the chrome. Thus, it is possible to quickly neutralize the charges on the front surface of the photomask by contacting the side surface of the photomask with a conductive material.

The following description is made of an optimal method for measuring the amount of charges accumulated on the photomask to be transported to the critical dimension scanning electron microscope (designed to measure a photomask), and is made of a system for reducing or eliminating a shift of a focal point of a charged particle beam and a variation in the magnification of the microscope. In the following description, the critical dimension scanning electron microscope is used as an example.

In order to solve the aforementioned problem, a surface electric potential sensor is provided in a sample transport mechanism to ensure that the amount of charges accumulated on the end portion of the back surface of the photomask can be measured. The sample transport mechanism is adapted to transport the photomask to the critical dimension scanning electron microscope designed to measure a photomask. Before the photomask is placed on the sample holder that moves in a vacuum chamber of the critical dimension scanning electron microscope designed to measure a photomask, the amount of charges accumulated on the end portion of the back surface of the photomask is measured by the surface electric potential sensor. Then, the electric potential on the front surface of the photomask, which is obtained when the photomask is transported from the sample transport mechanism to the sample holder, is estimated. When the estimated electric potential value is larger than a threshold value, a charge neutralization capability such as an ionizer is used to neutralize charges again. An electric potential larger than the threshold value may cause a shift of the focal point of a charged particle beam or cause a variation in the magnification of the microscope so as to cause a measurement error. The charge neutralization capability such as the ionizer is provided on the upstream side of the surface electric potential sensor.

The shift of the focal point of the charged particle beam and the variation in the magnification of the microscope are caused by a charge accumulated on the photomask depending on the process for manufacturing the pattern, the handling of the photomask, or the stored state of the photomask. However, the thus configured critical dimension scanning electron microscope is capable of reducing or eliminating a shift of the focal point of the charged particle beam and a variation in the magnification of the microscope. Therefore, the critical dimension scanning electron microscope (designed to measure a photomask) is highly reliable.

First Embodiment

In the first embodiment of the present invention, the critical dimension scanning electron microscope designed to measure a photomask is used as an example. However, another scanning electron microscope and the like, which are designed to measure a sample that may cause a problem similar to that of the photomask, may be applied to the first embodiment.

FIG. 1 is a diagram showing the entire configuration of a critical dimension scanning electron microscope for measuring a pattern fabricated on a photomask. The critical dimension scanning electron microscope includes a charged particle optical system 1, a sample holder 3, a sample chamber 4, a stage 5, a preparation chamber 6, gate valves 7 and 8. The charged particle optical system 1 emits a charged particle beam and deflects the charged particle beam. The stage holder 3 holds a photomask 2. The sample chamber 4 holds the sample holder 3 in a vacuum atmosphere and surrounds the photomask 2 to ensure that the photomask 2 is irradiated with the charged particle beam (electron beam in the present embodiment) emitted by the charged particle beam optical system 1. The stage 5 moves the photomask 2 in at least a direction perpendicular to the direction of propagation of the electron beam. A vacuum pump (not shown) is attached to the preparation chamber 6. The vacuum pump is adapted to exhaust a gas surrounding the photomask 2 to be measured and thereby evacuate the sample chamber 4. In addition, the vacuum pump is adapted to deliver a gas surrounding the measured photomask 2 to an atmosphere. The gate valve 7 is provided between the sample chamber 4 and the preparation chamber 6. The gate valve 8 is provided between the preparation chamber 6 and an area surrounded by the atmosphere.

In the present embodiment, the sample holder 3 holding the photomask 2 moves between the preparation chamber 6 and the sample chamber 4. The present embodiment is not limited to this. For example, the photomask 2 may be transported to the sample chamber 4 under the condition that the photomask 2 is not held by the sample holder 3 or the like. In this case, the stage 5 has the same function as that of the sample holder 3 used in the present embodiment.

The sample transport mechanism 9 that transports the photomask 2 to the sample holder 3 placed in the preparation chamber 6 is placed on the side of the atmosphere with respect to the gate valve 8 (or placed on the atmospheric side of the gate valve 8).

The sample transport mechanism 9 has an opener 11, an aligner 12 and a transport robot 13. The opener 11 is adapted to open and close a mask case 10 (maintenance mechanism). The mask case 10 is adapted to accommodate the photomask 2. The aligner 12 is adapted to align the orientation of the photomask 2 with the orientation of the sample holder 3 placed in the preparation chamber 6. The transport robot 13 is adapted to transport the photomask 2 between the opener 11 and the aligner 12 and between the aligner 12 and the sample holder 3.

Figure 5:
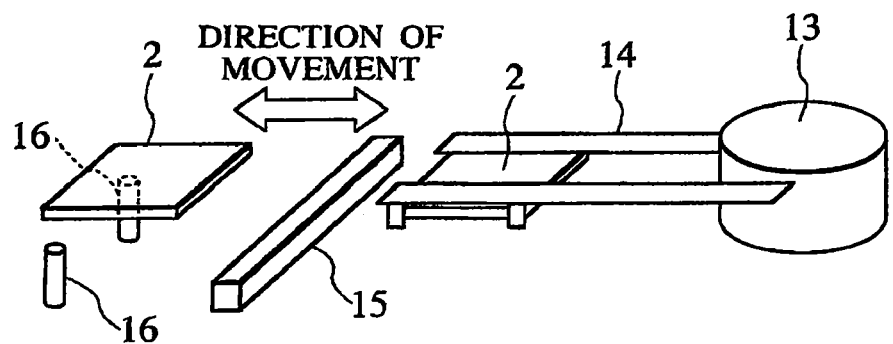
FIG. 5 is a diagram showing a method for measuring the amount of charges accumulated on the back surface of the photomask.
Figure 6:
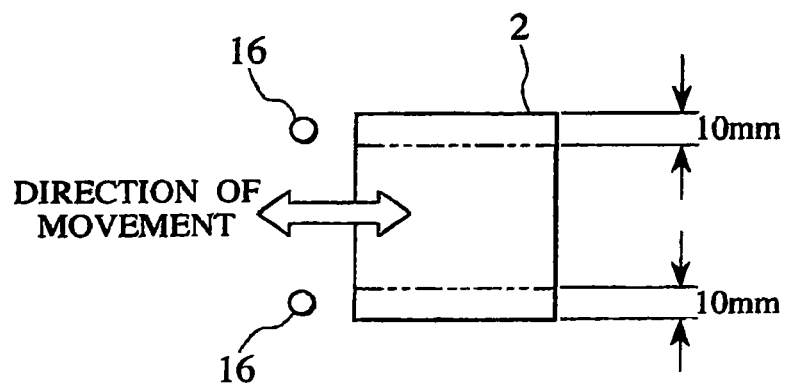
FIG. 6 is a diagram showing an arrangement of surface electric potential sensors.

The transport robot 13 has a robot arm 14 that holds the photomask 2. The robot arm 14 clamps side surfaces of the photomask 2 to hold the photomask 2. Conductive resin is used as a material of the robot arm 14. Conductive chrome is present on the photomask 2. The conductive chrome extends to the side surfaces of the photomask 2. The robot arm 14 grounds the conductive chrome present on the side surfaces of the photomask 2 and neutralizes a charge on the photomask 2. As shown in FIG. 5, an ionizer 15 is provided in the vicinity of the preparation chamber 6. The ionizer 15 is adapted to uniformly neutralize an electrification on a front surface of the photomask 2 and irradiate a back surface of the photomask 2 with ions. If a pattern surface of the photomask 2, on which a pattern is provided, is likely to be charged, two or more ionizers may be provided to irradiate the front and back surfaces of the photomask 2 with ions.

Figure 3:
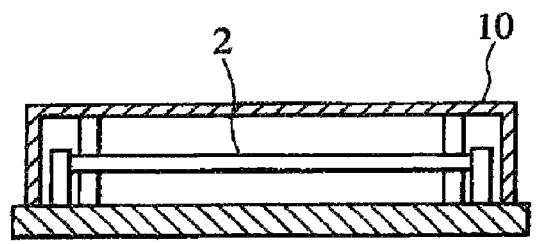
FIG. 3 is a diagram showing the state where a photomask is accommodated in a mask case.

The photomask 2 is accommodated and held in the mask case 10 as shown in FIG. 3. The mask case 10 maintains a measurement conditions to be clean. The photomask 2 is first set to the opener 11. Then, a lid of the mask case 10 is open. The photomask 2 is transported to the aligner 12 by the transport robot 13. After that, the photomask 2 is positioned by the aligner 12. Then, the photomask 2 is transported to the sample holder 3 placed in the preparation chamber 6 by the transport robot 13. The gate valve 8 is then closed to evacuate the preparation chamber 6. Then, the gate valve 7 is open. The sample holder 3 is transported to the sample chamber 4 under the condition that the sample holder 3 holds the photomask 2. The photomask 2 is placed in the sample chamber 4 to ensure that the pattern surface of the photomask 2 faces the charged particle optical system 1. The stage 5 moves the photomask 2 to position a portion of the photomask 2 at an area to be irradiated with the charged particle beam. Then, the width or the like of a portion of the pattern is measured.

In the present embodiment, two surface electric potential sensors 16 are provided in the vicinity of the ionizer 15 included in the sample transport mechanism 9. In addition, the two surface electric potential sensors 16 are located in the path of a movement of the transport robot 13 that moves between the sample transport mechanism 9 and the preparation chamber 6. Furthermore, the two surface electric potential sensors 16 are arranged to be able to measure respective end portions (having widths of approximately 10 mm) of the back surface of the photomask 2. The surface electric potential sensors 16 are located outside the transport route of the photomask 2 that is transported by the sample transport mechanism 9. When the photomask 2 is transported by the sample transport mechanism 9 and passes above the surface electric potential sensors 16, the back surface of the photomask 2 faces the surface electric potential sensors 16. The surface electric potential sensors 16 are capable of detecting the amounts of charges accumulated on the respective portions near an edge of the photomask 2.

In the present embodiment, each of the portions near an edge has the largest amount of charges. The largest amount of charges accumulated on the back surface of the photomask is determined by the measurement performed in the present embodiment. An electric potential on the front surface of the photomask, which is obtained when the photomask 2 is transported to the sample holder 3, is experimentally calculated based on the largest amount of charges. Thus, the electric potential on the front surface of the photomask can be estimated. It is therefore possible to correct the focal point of the charged particle beam and the magnification of the microscope. In addition, a period of time for neutralizing charges accumulated on the back surface of the photomask 2 is set based on the largest amount of charges. Therefore, the neutralization time can be set based on the largest amount of charges for each photomask 2.

In the present embodiment, the scanning electron microscope is configured to ensure that the other portions of the photomask 2, which are different from the portions near an edge of the photomask 2, do not contact any member, in order to maintain a function of the photomask 2. This suppresses electrification on the other portions of the photomask 2 due to a friction or the like. The largest amount of charges tends to be detected on portions near an edge (portions that contact a mechanism for transporting a photomask, a maintenance mechanism, or another member used in a manufacturing process before a measurement and inspection performed by a scanning electron microscope) of a sample such as a photomask. In the present embodiment, therefore, the surface electric potential sensors 16 are capable of measuring electric potentials on the transport route of the end portions of the back surface of the photomask 2 which is transported by the transport robot 13. This is because the end portions of the back surface of the photomask 2 pass above the surface electric potential sensors 16.

Figure 7:
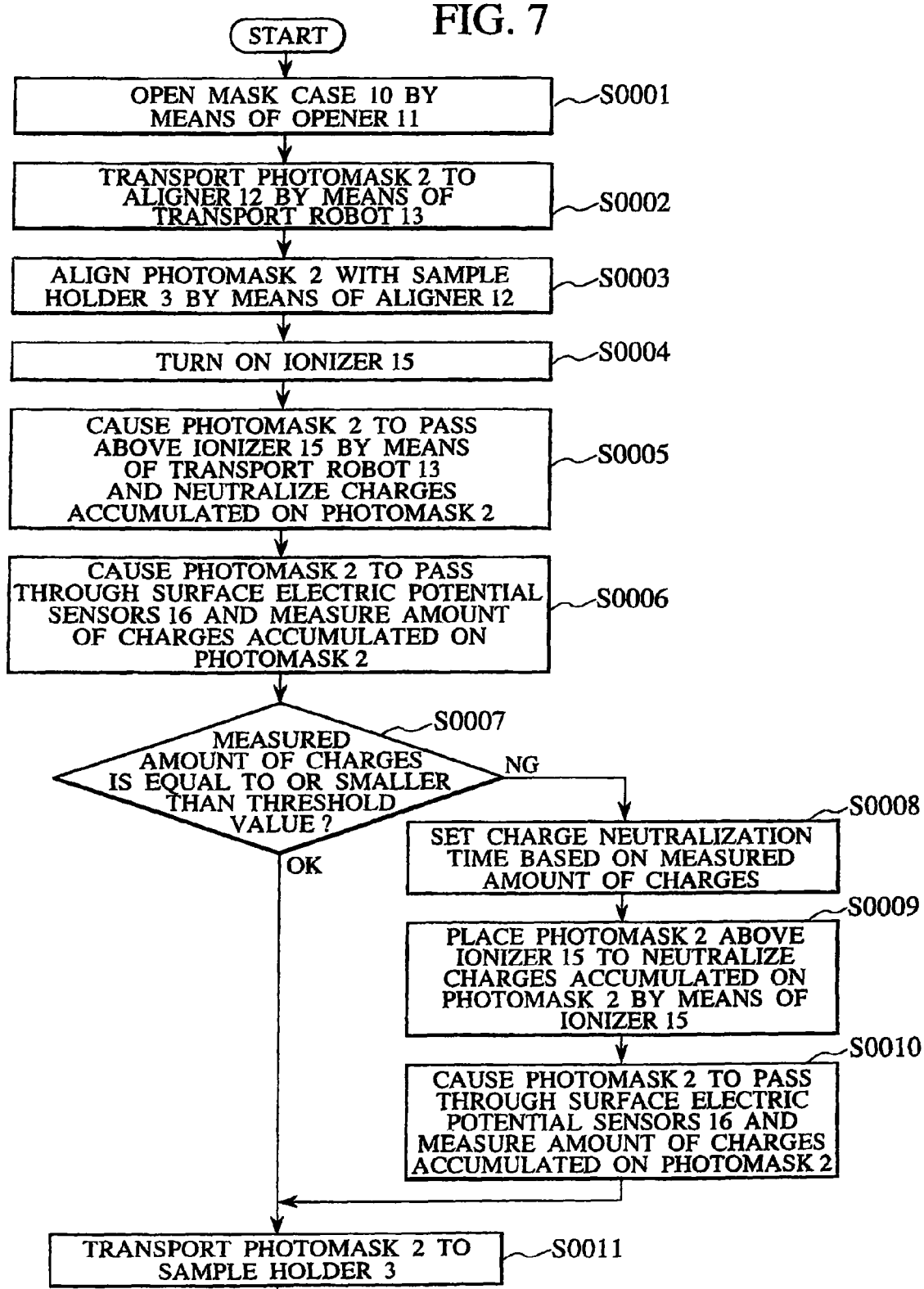
FIG. 7 is a flowchart showing a process for transporting the photomask.

FIG. 7 is a flowchart showing the process for transporting the photomask 2 from the mask case 10 to the sample holder 3 of the scanning electron microscope having the aforementioned configuration. The scanning electron microscope shown in FIG. 1 is connected with a controller 18. The controller 18 has a memory medium storing a program that automatically executes the process shown in FIG. 7.

The photomask 2 accommodated in the mask case 10 is treated as a target to be measured. In the process shown in FIG. 7, the opener 11 first opens the mask case 10 based on a measurement instruction transmitted by the controller in step S0001. Next, the transport robot 13 extracts the photomask 2 from the mask case 10 and transports the photomask 2 to the aligner 12 in step S0002. Then, the aligner 12 aligns the photomask 2 with the sample holder 3 in order to properly place the photomask 2 on the sample holder 3 in step S0003. The transport robot 13 causes the aligned photomask 2 to passes above the ionizer 15 in a process for transporting the aligned photomask 2 to the sample chamber 4 by means of the transport robot 13. In this case, since the ionizer 15 is in an ON state, a charge accumulated on the photomask 2 is neutralized when the photomask 2 passes above the ionizer 15 in step S0005.

Then, the photomask 2 subjected to the neutralization moves and passes through the surface electric potential sensors 16. When the photomask 2 passes through the surface electric potential sensors 16, the surface electric potential sensors 16 measure the amount of charges accumulated on the photomask 2 in step S0006. The scanning electron microscope determines whether or not the measured amount of charges is larger than the threshold value in step S0007. When the measured amount of charges is equal to or smaller than the threshold value, the transport robot 13 transports the photomask 2 to the sample holder 3. When the measured amount of charges is larger than the threshold value, a period of time for neutralizing charges accumulated on the photomask 2 by means of the ionizer 15 is set to ensure that the measured amount of charges is smaller than the predetermined threshold value in step S0008. After the setting of the neutralization time, the ionizer 15 neutralizes the charges accumulated on the photomask 2 in step S0009.

In the present embodiment, the surface electric potential sensors 16 are arranged in a direction perpendicular to the direction of the movement of the photomask 2 and parallel to the front surface (pattern surface) or back surface of the photomask 2 to be able to measure the amounts of charges accumulated on end portions of the back surface of the photomask 2. The end portions of the back surface of the photomask 2 include ends of the photomask 2 and have widths of 10 mm, respectively. The reason for selectively arranging the surface electric potential sensors 16 to measure the end portions of the back surface of the photomask 2 is that the end portions will contact another member.

In the present embodiment, the ends of the photomask 2 are held in the mask case 10. The possibility of contacting the ends of the photomask 2 with another member is the highest among the possibilities of contacting other portions of the photomask 2 with another member. It is expected that the amounts of charges accumulated on the end portions are the largest among amounts of charges accumulated on all portions of the photomask 2. Thus, the surface electric potential sensors 16 are provided to selectively measure the amount of charges accumulated on the end portions. That is, the surface electric potential sensors 16 are located outside the transport route of the photomask 2 and under the respective transport routes of the end portions of the photomask 2. In order to measure the amounts of charges accumulated on the entire photomask 2, three or more surface electric potential sensors 16 may be provided in a direction perpendicular to the direction of the movement of the photomask 2 and parallel to the pattern surface or back surface of the photomask 2. In the present embodiment, however, the two surface electric potential sensors 16 are provided to measure the end portions that are expected to have the largest amount of charges among all the portions of the photomask 2. This is because that the cost of manufacturing the scanning electron microscope can be reduced compared with the cost of manufacturing the scanning electron microscope having three or more surface electric potential sensors 16 and that a measurement of a portion having the largest amount of charges is sufficient for preventing a measurement error.

In the present embodiment, the end portions of the photomask 2 are treated as portions having the largest amount of charges as an example. The present embodiment is not limited to this. If a portion of the photomask 2, which is different from the end portions, will contact another member, another one or more of the two surface electric potential sensors 16 may be provided to selectively measure the amount of charges accumulated on the portion of the photomask 2. The portion of the photomask 2 that will contact another member may be a portion that will contact the sample transport mechanism 9, a portion that will contact another member in the mask case in which a sample is stored, a portion that will contact the transport mechanism or the maintenance mechanism in the process for manufacturing a semiconductor before the measurement performed by the critical dimension scanning electron microscope, or the like as a measurement target. In addition, the surface electric potential sensors 16 may be movable in response to a change in the position of a portion to be measured.

In addition, a Kelvin probe using the Kelvin method (vibrating capacitance method) may be used as the surface electric potential sensor.

The robot arm 14 has hang portions that contact a lower portion (back surface) of the photomask 2 to hang the photomask 2. The hang portions partially hold portions (of the photomask 2) near edges of the photomask 2, respectively. The sizes of the hang portions are small enough to smoothly perform the measurement by means of the surface electric potential sensors 16 and smoothly neutralize charges accumulated on the photomask 2 by means of the ionizer 15.

When the measured amount of charges becomes equal to or lower than the predetermined threshold value due to the neutralization, an optimal focus point can be found by shifting the focal point of the charged particle optical system 1 by a predetermined amount based on a predetermined standard focus condition. The focal point is adjusted by controlling an excitation current to be applied to an objective lens or a voltage to be applied to the objective lens or controlling a negative voltage (hereinafter referred to as a retarding voltage) to be applied to the sample. The amount of the shift of the focal point may be controlled based on the measured largest amount of charges. The focal point of the charged particle optical system 1 that emits a charged particle beam to the front surface of the sample is adjusted based on the measurement of the electric potential on the back surface of the sample. Thus, the focal point can be adjusted at high speed and with high accuracy regardless of charges accumulated on the back surface of the sample.

Second Embodiment

The second embodiment of the present invention describes an example in which the amount of charges appearing on the front surface of the sample is estimated based on the amount of charges accumulated on the back surface of the sample, and the focal point is adjusted based on the estimated amount. The effect of charges accumulated on the back surface of sample, which is described in the first embodiment, appears on the front surface of the sample when the sample is placed on the sample holder. As an example, a distribution of the charges accumulated on the back surface of sample antisymmetrically appears on the front surface of the sample. The present embodiment describes an example where the focal point is adjusted at high speed and with high accuracy regardless of the charges. In addition, the present embodiment assumes that three or more surface electric potential sensors are arranged in a direction perpendicular to the direction of a movement of the sample to be able to two-dimensionally measure the amounts of charges accumulated on the back surface of the sample.

Figure 2:
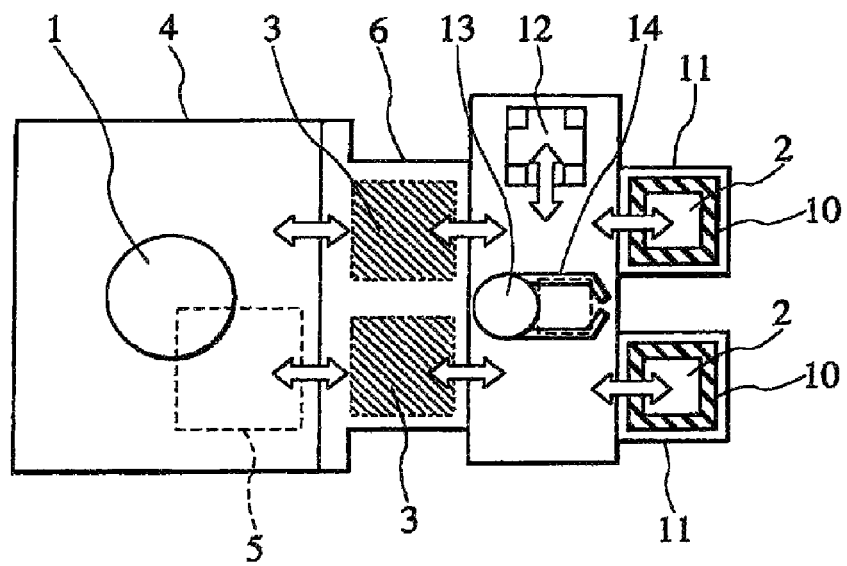
FIG. 2 is a diagram showing a transport route of the critical dimension scanning electron microscope.
Figure 4:
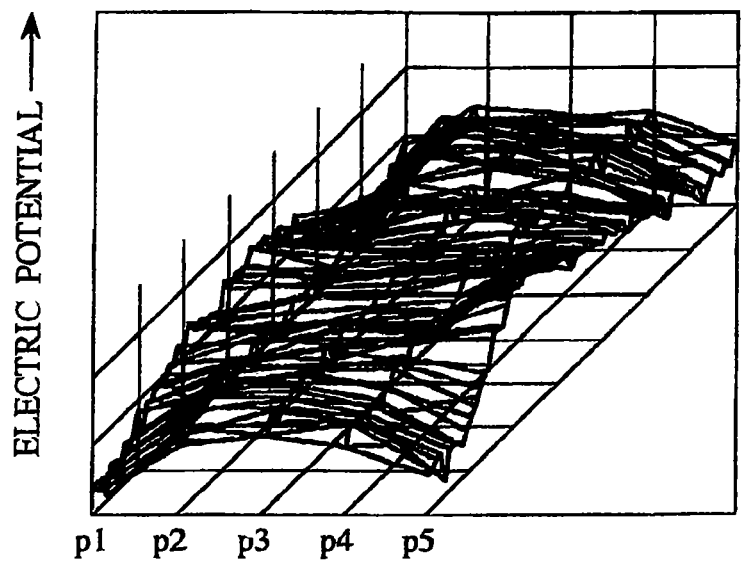
FIG. 4 is a graph showing the state of a back surface of the photomask charged when the photomask is accommodated.

When the photomask 2 is placed on the sample holder 3, an electric potential distribution may appear on the front surface (pattern surface) of the photomask 2. The electric potential distribution is caused by charges adhering to the back surface of the photomask 2. Thus, the electric potential distribution that appears on the front surface of the photomask 2 is estimated based on the result of the measurement of electric potentials on the back surface of the photomask 2. The focal point is adjusted based on the estimated electric potential distribution. Specifically, an electric potential map shown in FIG. 4 is created based on the measured amount of charges adhering to the back surface of the photomask 2, and a focus condition of the charged particle beam system is adjusted based on the electric potential map. In this case, five surface electric potential sensors p1 to p5 are used to measure the amounts of charges accumulated on the back surface of the photomask 2. After that, an electric potential on a point of the back surface of the photomask 2 is interpolated between measured points of the back surface of the photomask 2 by approximating functions to create the electric potential map. The five surface electric potential sensors p1 to p5 are arranged in a direction perpendicular to the direction (shown in FIG. 2) of a movement of the photomask 2 and parallel to the pattern surface (front surface) of the photomask 2.

The electric potential map created in the abovementioned way indicates the electric potentials on the back surface of the photomask 2. Values of the electric potential map are multiplied by a predetermined coefficient to obtain electric potentials on points of the front surface of the photomask 2 as a distribution of the electric potentials on the front surface of the photomask 2 in the present embodiment. When an electric potential (amount of charges) on a certain point on the back surface of the photomask is Vb, an electric potential on a point (corresponding to the certain point on the back surface of the photomask 2) on the front surface of the photomask 2 is represented by the following value Va.

$$Va = k \times Vb [V] \quad (1)$$

The symbol k is the coefficient that can be adjusted depending on the thickness of the sample, the material property of the sample, the position of a measurement point of the sample, a measurement conditions, a pattern formed on the sample and the like. When the electric potential distribution on the front surface of the sample are lower than the electric potential distribution on the back surface of the sample, the coefficient k is lower than 1.0. The coefficient is obtained experimentally or by a simulation. In addition, the aforementioned approximating functions may be performed on the electric potential on each point measured after the adjustment of the coefficient.

When the focal point needs to be adjusted by controlling the retarding voltage, the calculated electric potential Va on the front surface of the photomask 2 is superimposed on a predetermined retarding voltage Vr. Then, the retarding voltage is changed to a predetermined value by using the superimposed voltage as a standard to find an optimal focal point.

The abovementioned system allows its focal point to be adjusted at high speed and with high accuracy regardless of charges accumulated on the back surface of the sample.

In the above description, the focal point is adjusted based on the estimated amount(s) of charges as an example. However, the magnification may be adjusted based on the estimated amount(s) of charges.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A method for measuring a pattern on a photomask with a charged particle beam system after measuring an electric potential on the photomask using an electric potential sensor, the method comprising steps of:
    measuring the electric potential on a first surface of the photomask by using the electric potential sensor provided outside a transport route of the photomask, the first surface being located on the opposite side of a second surface of the photomask, the second surface having a pattern thereon; and
    transporting the photomask to a charged particle optical system of the charged particle beam system as the second surface of the photomask faces the charged particle optical system, when the measured electric potential is equal to or smaller than a predetermined threshold value.

2. The method according to claim 1, further comprising the step of:
    neutralizing a charge accumulated on the photomask by means of an ionizer when the measured electric potential is larger than the predetermined threshold value.

3. The method according to claim 2, wherein a period of time for the neutralization by the ionizer is controlled based on the measured electric potential.

4. The method according to claim 1, further comprising the step of:
    neutralizing a charge accumulated on the photomask by means of an ionizer to ensure that the largest electric potential measured by the electric potential sensor is equal to or smaller than a predetermined value.

5. A charged particle beam system comprising:
    a charged particle optical system;
    a holding mechanism that holds a photomask;

a transport mechanism that transports the photomask between the holding mechanism and the charged particle optical system; and an electric potential sensor that is provided outside the transport route of the photomask transported by the transport mechanism and is adapted to measure an electric potential on a first surface of the photomask, the first surface being located on the opposite side of a second surface of the photomask, the second surface having a pattern thereon, wherein when the electric potential measured by the electric potential sensor is equal to or smaller than a predetermined threshold value, the photomask is transported to the charged particle optical system and placed to ensure that the second surface of the photomask faces the charged particle optical system.

6. The system according to claim 5, further comprising:
an ionizer for neutralizing a charge accumulated on the photomask when the measured electric potential is larger than the predetermined threshold value.

7. The method according to claim 6, wherein a period of time for the neutralization by the ionizer is controlled based on the measured electric potential.

8. The system according to claim 5, further comprising:
an ionizer for neutralizing a charge accumulated on the photomask to ensure that the largest electric potential measured by the electric potential sensor is equal to or smaller than a predetermined value.

* * * * *